April 8, 1952 G. J. BARRY 2,591,667

ILLUMINATED TUNING DIAL

Filed April 19, 1947

*INVENTOR.*
GERALD J. BARRY
BY [signature]
ATTORNEY

Patented Apr. 8, 1952 2,591,667

UNITED STATES PATENT OFFICE 2,591,667

ILLUMINATED TUNING DIAL

Gerald J. Barry, Fort Wayne, Ind., assignor, by mesne assignments, to Farnsworth Research Corporation, a corporation of Indiana Application April 19, 1947, Serial No. 742,721

5 Claims. (Cl. 116—124.4)

This invention relates generally to tuning indicators for radio receivers and more particularly it relates to an indirectly illuminated tuning indicator.

It is conventional practice in radio receivers to provide a tuning indicator, the face of which bears a scale indicative of the tuning range of the receiver. It is desirable that, in a home radio receiver, such an indicator should be harmonious with the receiver cabinet structure, yet at the same time should be easily visible to the operator of the receiver. The problem of tuning indicator visibility is often solved by the employment of a relatively large and bright dial face having enlarged tuning indicia thereon which is subjected to intense illumination. Understandably this type of indicator is relatively expensive to manufacture and install, and usually detracts from the overall external appearance of a receiver. It is further known that the accompanying glare from a brightly illuminated dial is generally conducive to eye strain if observed for a considerable length of time.

In a comparatively small radio receiver, a tuning indicator having large indicia thereon may cover a relatively large area of the front wall of the receiver. On the other hand, if the tuning dial and indicia are reduced in size, the indicator is then comparatively difficult to read even though subjected to intense illumination. Thus, there is need for a tuning indicator which presents a subdued and harmonious effect to the observer by reason of diffused illumination, the tuning indicia thereon being prominent and the associated index pointer being sufficiently illuminated to be readily visible.

Accordingly, it is an object of this invention to provide a radio receiver tuning indicator, having arranged thereon comparatively large tuning indicia and an index pointer adapted for ease of visibility in tuning.

Another object of the present invention is to provide a receiver tuning indicator which is relatively inexpensive to manufacture, simple to install and attractive in appearance.

A further object of the present invention is to provide a radio tuning dial adaptable for small radio receivers wherein subdued illumination is applied to relatively large tuning indicia and an associated index pointer.

In accordance with this invention there is provided a tuning indicator for radio receivers, comprising a scale, a pointer knob and a source of light for indicating the tuning adjustment of the associated radio receiver. The scale consists of a light transmitting arcuate member having radially extending light transmitting numerals formed on the outer periphery thereof. The source of light is arranged adjacent to the arcuate member for the illumination thereof, and the extending numerals. A rotatable opaque pointer knob is disposed adjacent to said arcuate member in light shielding relation thereto and contains a light transmitting aperture in alignment with said arcuate member for indicating the receiver tuning adjustment.

For a better understanding of the invention, together with other and further objects thereof, reference is made to the following description, taken in connection with the accompanying drawing, and its scope will be pointed out in the appended claims.

Figure 1:
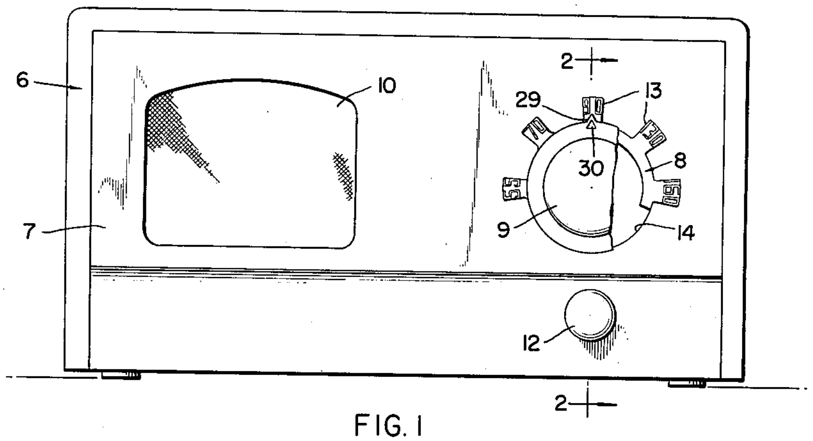
Fig. 1 is a front elevation of a radio receiver illustrating the tuning indicator, the loud-speaker grill and a control knob.

Referring to the drawing, there is provided, in accordance with this invention, a radio receiver including a cabinet 6, and a front panel 7 having arranged thereon a tuning indicator comprising an arcuate scale member 8 and a rotatable pointer knob 9. There is also provided a loudspeaker grill 10 behind which may be a loudspeaker for reproducing received signals. A control knob 12 is conventionally provided for switching the receiver on or off and for controlling the volume level thereof. For indicating the tuning adjustment of the receiver, the arcuate scale member 8 is provided with appropriate tuning indicia in the form of numerals 13. The arcuate scale member 8 is retained within an aperture 14, in the front panel 7, by means of detents 15. A plurality of retaining slots, such as shown at point 16, are arranged around the perimeter of the aperture 14 and are adapted to receive the detents 15. The arcuate scale member 8 will then be securely held in position around the rim of the aperture 14, by the frictional engagement between the detents 15 and the retaining slots 16. In its preferred embodiment, the arcuate scale member 8 is composed of a suitable light transmitting plastic substance such as methyl, methacrylate resin, and it is contemplated that this scale member 8, together with its numerals 13 and detents 15 are to be suitably molded as a unitary structure.

Figure 2:
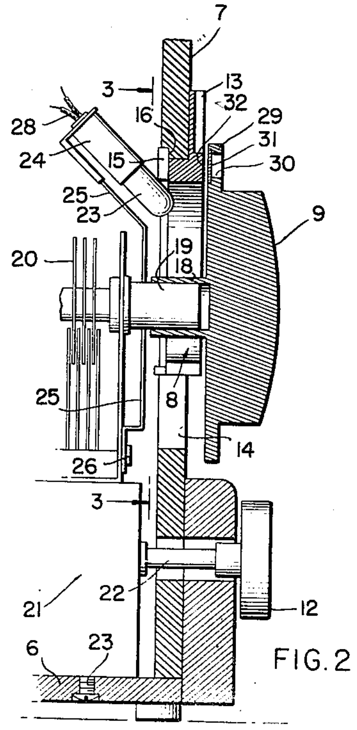
Fig. 2 is an enlarged cross section taken on line 2—2 of Fig. 1 and showing the tuning indicator together with a light source.
Figure 3:
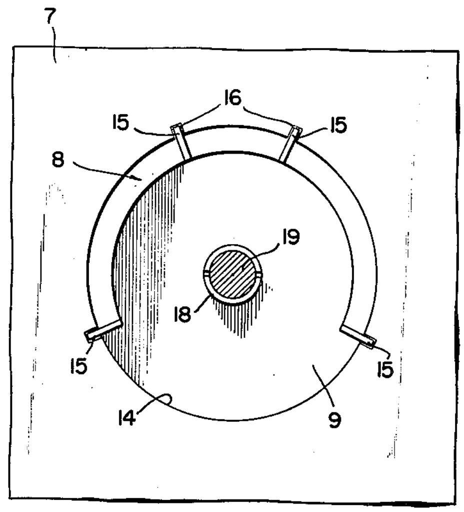
Fig. 3 is an enlarged cross section taken on line 3—3 of Fig. 2 and showing a rear portion of the tuning indicator and the method of supporting the light transmitting arcuate scale member.

A cross sectional view of the arcuate scale member 8, as illustrated in Fig. 2, shows that the detent pins are arranged at the rear surface, whereas the numerals 13 extend upwardly from the front surface so as to substantially project above the indicator knob 9. The indicator knob 9 is of opaque substance and is concentrically arranged with respect to the aperture 14 on the front panel 7 and is supported by suitable engagement between a tuning knob hub 18 and a shaft 19 of a tuning condenser 20. The tuning condenser 20 is fastened to a chassis 21 which also supports a control shaft 22 to which the control knob 12 is affixed. The chassis 21 may be suitably maintained within a receiver cabinet 6 by means of mounting screws shown at 23. It will be evident that the arcuate scale member 8 is to be conventionally correlated with the frequency tuning range of the tuning condenser 20 whereby the rotatable pointer knob 9 may be moved to adjust the condenser 20 to a predetermined frequency and, at the same time, to appropriately indicate this particular frequency on the arcuate scale member 8.

A light source 23, which may be a dial light bulb, is shown angularly supported in a socket 24 within the upper portion of the aperture 14, whereby light rays from the source 23 may impinge upon the adjacent light conducting arcuate scale member 14. The light source 23 and socket 24 are held in position by a supporting arm 25, the lower extremity of which is fastened to the tuning condenser 20 by means of a rivet 26. A conductor pair 28 is connected within the socket 24 to the light source 23 whereby a power source, not shown, may be connected thereto in conventional manner to energize the light source.

The rotatable pointed knob 9 of opaque substance and substantially circular in shape is arranged to shield the aperture 14 and the face portion 32 of the arcuate scale member 8 from the observer. The pointer knob 9 is also provided with a protuberance 29 on the outer periphery thereof which serves as an index pointer and adjacent thereto and in alignment therewith, is a triangularly shaped aperture 30 having contained therein a light transmitting colored window 31. The colored window 31 is adapted to traverse the face portion 32 of the light transmitting arcuate scale member 8 which is generally covered and light shielded by the opaque body of the rotatable pointer knob 9.

Consideration will now be given to the operation of a tuning indicator. Assume now that the operator has manipulated the control knob 12 to operatively condition the receiver for the reception of carrier signals. There will now conventionally have been applied to the light source 23 an energizing current whereby light rays are generated and caused to impinge upon the arcuate scale member 8. The light conducting properties of the arcuate scale member 8 cause the collected light rays to be distributed throughout its length and to also diffusedly illuminate the numerals, such as 13, which are representative of the tuning indicia appropriate to the receiver.

The opaque pointer knob 9 substantially light shields the arcuate scale member 8 except for the projecting numerals 13. Thus, to the operator, the numerals 13 are outstandingly illuminated against the front panel 7. At the same time, a portion of light rays collected by the arcuate scale member 8 are transmitted through the aperture 30 and the colored window 31 thereby providing an index as to the particular tuning adjustment of the receiver. As the pointer knob 9 is rotated the shaft 19 and the tuning condenser 20 will likewise be moved whereby to render the receiver responsive to a carrier signal of predetermined frequency, as indicated on the arcuate scale member 8 and which will be reproduced by the loud-speaker 10.

It is to be understood that the method herein shown whereby the light source 23 is arranged adjacent to the apex of the arcuate scale is purely illustrative, and is not to be considered a limitation. It is within the scope of this invention to utilize a plurality of light sources which may suitably dispose the various points adjacent to the inner periphery or ends of the arcuate scale member 8.

It will be evident that the numerals 13 of the arcuate scale member 8 may be of a substantially large size, and that the diffused illumination thereof provides for easy visibility and creates a subdued and harmonious effect with respect to the external appearance of the receiver.

While there has been described what is at present considered the preferred embodiment of the invention, it will be obvious to those skilled in the art that various changes and modificattions may be made therein without departing from the invention, and it is, therefore, aimed in the appended claims to cover all such changes and modifications as fall within the true spirit and scope of the invention.

What is claimed is:

1. A radio tuning indicator comprising a dial, said dial including a light transmitting member and numerals formed of light transmitting material projecting from one edge of said member and adapted to be illuminated by light impinging on said member, a movable, relatively opaque member disposed adjacent said light transmitting member in shielding relation thereto, said opaque member having formed therein a light transmitting portion in alignment with said light transmitting member for illumination by light impinging on said member, said light transmitting portion being aligned with selectable ones of said numerals in accordance with, and for indicating, a radio tuning adjustment and a source of light for illuminating said light transmitting member.

2. A radio tuning indicator comprising a dial, said dial including an arcuate light transmitting member and numerals formed of light transmitting material protruding from the periphery of said member, and adapted to be illuminated by light impinging upon said member, a rotatable member disposed adjacent said arcuate light transmitting member in shielding relation thereto, said last mentioned member having formed therein a member aligned with selectable ones of said numerals in accordance with, and for indicating a radio tuning adjustment, and a source of light for illuminating said arcuate member.

3. A radio tuning indicator comprising a dial, said dial including an arcuate light transmitting member having numerals formed of light transmitting material extending from the outer periphery of said member and adapted to be illuminated by light impinging on said member, a rotatable control knob including a member disposed adjacent said arcuate member in shielding relation thereto, said last mentioned member having formed therein a light transmitting portion in alignment with said arcuate member and selectable ones of said numerals in accordance with, and for indicating, a radio tuning adjustment and a source of light adjacent an edge of said arcuate member for illuminating said arcuate member 4. A radio tuning indicator comprising a dial, said dial including an arcuate light transmitting member and radially extending numerals formed of light transmitting material on the outer periphery of said member and adapted to be illuminated by light impinging on said member, a rotatable control knob including an annular opaque member disposed adjacent said arcuate member in shielding relation thereto, said opaque member having formed therein a light transmitting portion in alignment with selectable ones of said numerals in accordance with, and for indicating, a radio tuning adjustment and a source of light adjacent a peripheral edge of said arcuate member for illuminating said numerals.

5. A radio tuning indicator comprising a dial, said dial including a continuous arcuate light transmitting member and radially extending numerals formed of light transmitting material on the outer periphery of said member and adapted to be illuminated by light impinging on said member, a rotatable control knob including an annular opaque member disposed adjacent said arcuate member in shielding relation thereto, said opaque member having formed therein a light transmitting portion in alignment with selectable ones of said numerals in accordance with, and for indicating, a radio tuning adjustment and a source of light adjacent the inner peripheral edge of said arcuate member for illuminating it and said numerals.

GERALD J. BARRY.

REFERENCES CITED

The following references are of record in the file of this patent:

UNITED STATES PATENTS

| Number | Name | Date |
|---|---|---|
| 2,028,137 | Collins | Jan. 21, 1936 |
| 2,060,537 | Smith | Nov. 10, 1936 |
| 2,117,441 | McWeeny | May 17, 1938 |